(12) United States Patent
Herer et al.

(10) Patent No.: US 11,899,226 B2
(45) Date of Patent: Feb. 13, 2024

(54) OPTICAL APPARATUS AND METHODS AND COMPUTER PROGRAM PRODUCTS USEFUL FOR MANUFACTURING SAME

(71) Applicant: Maradin Ltd., Yoqne'am (IL)

(72) Inventors: Inbal Herer, Kibbutz Ramat Hashofet (IL); Adi Baram, Yoqneam (IL); Matan Naftali, Moshav Aloney-Aba (IL)

(73) Assignee: MARADIN TECHNOLOGIES LTD., Yoqne'am (IL)

( * ) Notice: Subject to any disclaimer, the term of this patent is extended or adjusted under 35 U.S.C. 154(b) by 0 days.

(21) Appl. No.: 17/690,442

(22) Filed: Mar. 9, 2022

(65) Prior Publication Data

US 2022/0268977 A1 Aug. 25, 2022

Related U.S. Application Data

(63) Continuation of application No. 16/059,588, filed on Aug. 9, 2018, now Pat. No. 11,307,335.

(60) Provisional application No. 62/542,819, filed on Aug. 9, 2017.

(51) Int. Cl.
| | |
|---|---|
| *G02B 5/08* | (2006.01) |
| *G02B 5/20* | (2006.01) |
| *C03C 25/223* | (2018.01) |
| *G02B 1/10* | (2015.01) |
| *G02B 27/09* | (2006.01) |
| *B81B 3/00* | (2006.01) |
| *G02B 26/08* | (2006.01) |

(52) U.S. Cl.
CPC ............... *G02B 5/08* (2013.01); *B81B 3/00* (2013.01); *C03C 25/223* (2013.01); *G02B 1/10* (2013.01); *G02B 5/20* (2013.01); *G02B 26/0833* (2013.01); *G02B 27/0977* (2013.01)

(58) Field of Classification Search
CPC ... G02B 5/08; G02B 5/20; G02B 1/10; G02B 26/0833; G02B 27/0977; B81B 3/00; C03C 25/223
See application file for complete search history.

(56) References Cited

U.S. PATENT DOCUMENTS

| | | | |
|---|---|---|---|
| 5,315,429 | A | 5/1994 | Abramov |
| 6,088,163 | A | 7/2000 | Gilbert et al. |
| 7,009,745 | B2 | 3/2006 | Miller et al. |
| 7,113,337 | B2 | 9/2006 | Lazarev et al. |

(Continued)

FOREIGN PATENT DOCUMENTS

| | | | |
|---|---|---|---|
| CN | 1459843 | A * | 12/2003 |
| JP | H087003 | A * | 1/1996 |

(Continued)

OTHER PUBLICATIONS

Gunda, "Anti-Stiction Coatings for High Reliability MEMS", Surmet Corp (1803).

(Continued)

*Primary Examiner* — Collin X Beatty
(74) *Attorney, Agent, or Firm* — Browdy and Neimark, PLLC

(57) ABSTRACT

Optical apparatus comprising a MEMS substrate having a surface; and a stack of optical coatings which is deposited on the MEMS substrate's surface and which modifies at least one property of light impinging on the stack.

17 Claims, 13 Drawing Sheets

(56) References Cited

U.S. PATENT DOCUMENTS

| | | | |
|---|---|---|---|
| 7,200,298 B2* | 4/2007 | Kimura | G02B 26/0808 385/47 |
| 7,859,752 B2 | 12/2010 | Weick | |
| 2004/0136044 A1 | 7/2004 | Miller et al. | |
| 2004/0176868 A1* | 9/2004 | Haga | G05B 19/418 700/121 |
| 2007/0285601 A1 | 12/2007 | Hendrix | |
| 2009/0190202 A1 | 7/2009 | Moidu | |
| 2010/0265467 A1 | 10/2010 | Lescure et al. | |
| 2016/0170202 A1* | 6/2016 | Yasuda | G02B 26/12 359/201.2 |
| 2016/0232858 A1 | 8/2016 | Pan | |
| 2016/0377781 A1 | 12/2016 | Park | |
| 2017/0285238 A1* | 10/2017 | Hirshberg | G02B 27/283 |
| 2018/0307039 A1 | 10/2018 | Payne | |

FOREIGN PATENT DOCUMENTS

| | | | | |
|---|---|---|---|---|
| JP | 2014072313 A | * | 4/2014 | G01B 11/26 |
| WO | 9517691 A1 | | 6/1995 | |

OTHER PUBLICATIONS

Accucoat inc. coating for optics (Aug. 2017) <http://accucoatinc.com/>.

Helmbrecht et al., "Advanced optical coatings of a segmented MEMS DM", MEMS Adaptive Optics III (vol. 7209, pp. 1-4, (Feb. 2009).

Casix Optics Capability Presenation (Aug. 2017) <http://www.casix.com/>.

LCMO Retarder (Feb. 2017) <http://www.rolic.com/fileadmin/daten/display/LCMO-Optical-Films/Rolic_LCMO-optical_film_TDS_demonstrator-QWP.pdf>.

Thorlabs, "Mounted Low-Order Wave Plates for MIR", <https://www.thorlabs.com/newgrouppage9.cfm?objectgroup_id=10053>, date unknown.

Helmbrecht et al., "Optical coatings for MEMS devices", CLEO/QELS: 2010 Laser Science to Photonic Applications (pp. 1-2). IEEE (2010).

Optical filters (Jan. 2017)., <http://www.izovac-coatings.com/en/products/optical_filters/>.

Alluxa, the next generation of optical filters (Aug. 2017) <https://www.alluxa.com/>.

Edmund Optics, "Optics—Imaging—Photonics—Optomechanics—Lasers", <http://www.edmundoptics.com/>, Jul. 17, 2015.

Zemax LLC, eGuide: How to fail fast and smart during the optical product design process, pp. 1-9 (2018).

Casix: high quality crystals, precision glass optics, fiber optics, coatings, glass components, and lenses, <https://web.archive.org/web/20170806062852/http://www.casix.com/>, Aug. 6, 2017.

* cited by examiner

Fig. 1a

1. Characterization of the MEMS mirror (flatness, radius of curvature) e.g. for stress analysis 2. Characterization (thickness calibration of layers deposited on the wafer, Refractive Index) of deposition layer materials, typically with high/low refractive indices 3. Simulation: Based on operation 2, perform optical analysis for filter typically including interspersed layers of the materials for (say) a 10 layer filter,... a 30 layer, 40 layer, 50 layer, ... and 100 layer filter.

4. Physical validation of simulation, typically for only a subset of the simulated filters 5. Tuning of the model 6. Based on a pre-defined trade-off between total layer thickness and optical performance, choose "optimal" filter from the subset of filters, which has good optical performance, yet is not too thick 7. Physical validation using an actual mirror (say) as the workpiece being coated; Coat mirror (wafer) with the number of layers that the "optimal" filter has e.g. using flow of fig. 1b below.

Fig. 1b

10: provide MEMS mirror to be coated

↓

20: Provide a "hard mask" typically for use at die level or alternatively at wafer level.

↓

30: Align the hard mask formed in operation 20, to the MEMS die (e.g. MEMS mirror of operation 10)  e.g. under a microscope.

↓

40:   Attach the aligned mask to the MEMS die or wafer

↓

50:   Plasma cleaning of the dies

↓

70:   preparation of dies for optical coating:

↓

80:   Apply optical coating e.g. by deposition, using high and low frequency plasma to tune each layer's optical property. Typically, add "escort" sample

↓

85:   Optical inspection of coated mirrors

↓

90:   Disassemble mirrors from carrier wafer.

↓

100:   Test "escort" sample: measure layer property and ensure ↓ QWP is working.

↓

110:   Conduct LDT.  If LDT test fails, tune process e.g. by modifying deposition temperature and/or number of layers   and run process again, using new parameters

Fig. 1c

210: Calibrate SiNx (or other 1$^{st}$ material) layer

↓

220: Calibrate SiO2 (or other 2nd material) layer

↓

230: Perform optical modeling e.g. using optical software such as Zemax

↓

240: Deposit several stacks and comparing the results to the optical model.

↓

250: Tune optical model according to the real result e.g. adjust thicknesses of layers, if and as needed.

↓

260: Run same stacks again and measure.

↓

270: Repeat the deposition, measurement and model tuning operations 240, 250 e.g. till required result, as per use-case requirements, is obtained.

Fig. 6a

| Layer | Stack0 (nm) | Stack1(nm) | Stack2(nm) | Stack3(nm) | Stack4(nm) | Stack5(nm) |
|---|---|---|---|---|---|---|
| AL | 100 | 100 | 100 | 100 | 100 | 100 |
| Low-T HF SIO2 | 103.26 | 102.5 | 102.15 | 103.59 | 102.46 | 102.26 |
| Low-T LF SINx | 74.33 | 75.05 | 74.88 | 75.08 | 74.97 | 75.08 |
| Low-T HF SIO2 | 106.29 | 106.84 | 107.03 | 107.17 | 106.88 | 107.07 |
| Low-T LF SINx | 76.89 | 77.75 | 78.07 | 77.9 | 77.7 | 77.68 |
| Low-T HF SIO2 | 110.86 | 110.27 | 110.52 | 110.14 | 110.04 | 109.97 |
| Low-T LF SINx | 81.66 | 80.45 | 80.13 | 79.83 | 79.95 | 79.83 |
| Low-T HF SIO2 | 119.58 | 114.83 | 113.99 | 113.67 | 113.52 | 113.62 |
| Low-T LF SINx | 86.74 | 85.18 | 84.22 | 83.96 | 83.62 | 83.94 |
| Low-T HF SIO2 | 121.8 | 122.37 | 121.68 | 121.89 | 120.55 | 121.72 |
| Low-T LF SINx | 87.41 | 89.22 | 89.74 | 89.59 | 89.22 | 89.55 |
| Low-T HF SIO2 | 125.74 | 123.54 | 124.64 | 123.62 | 124.36 | 123.83 |
| Low-T LF SINx | 91.81 | 89.01 | 88.95 | 87.89 | 88.8 | 88.08 |
| Low-T HF SIO2 | 129.1 | 125.97 | 124.6 | 124.84 | 124.4 | 124.56 |
| Low-T LF SINx | 90.35 | 93.11 | 93.53 | 92.89 | 92.19 | 92.72 |
| Low-T HF SIO2 | 132.81 | 130.8 | 139.33 | 131.69 | 132.1 | 132.41 |
| Low-T LF SINx | 94.85 | 94.05 | 97.57 | 93.61 | 95.1 | 94.1 |
| Low-T HF SIO2 | 125.94 | 131.61 | 336.47 | 131.89 | 131.26 | 130.77 |
| Low-T LF SINx | 93.84 | 96.61 | 103.56 | 98.02 | 96.65 | 96.84 |
| Low-T HF SIO2 | 160.87 | 135.63 | 142.74 | 140.03 | 139.34 | 140.33 |
| Low-T LF SINx | 77.24 | 98.12 | 96.74 | 111.82 | 100.44 | 100.57 |
| Low-T HF SIO2 | 161.32 | 137.12 | 138.13 | 394.32 | 139.52 | 140.42 |
| Low-T LF SINx | 96.85 | 99.77 | 102.13 | 11.19 | 111.46 | 117.78 |
| Low-T HF SIO2 | 137.76 | 139.65 | 138.68 | 390.66 | 189.64 | 11.3 |

| | | | | | | |
|---|---|---|---|---|---|---|
| Low-T LF SINx | 101.47 | 101.88 | 100.08 | 118.71 | 13.59 | 4.27 |
| Low-T HF SIO2 | 141.15 | 141.04 | 144.25 | 141.65 | 207.93 | 193.43 |
| Low-T LF SINx | 108.37 | 101.86 | 103.14 | 103.71 | 11.37 | 2.1 |
| Low-T HF SIO2 | 139.01 | 145.87 | 140.27 | 144.23 | 191.6 | 199.36 |
| Low-T LF SINx | 89.8 | 104.48 | 105.2 | 101.29 | 115.04 | 3.1 |
| Low-T HF SIO2 | 65.17 | 140.46 | 147.26 | 143.21 | 146.18 | 586.49 |
| Low-T LF SINx | | 112 | 101.66 | 104.6 | 106.98 | 7.46 |
| Low-T HF SIO2 | | 147.35 | 148.16 | 142.26 | 148.51 | 15.6 |
| Low-T LF SINx | | 85.84 | 110.06 | 103.71 | 104.34 | 119.31 |
| Low-T HF SIO2 | | 73.96 | 138.53 | 148.14 | 147.42 | 146.79 |
| Low-T LF SINx | | | 114.66 | 102.85 | 107.35 | 107.02 |
| Low-T HF SIO2 | | | 156.63 | 146.43 | 144.37 | 147.24 |
| Low-T LF SINx | | | 81.61 | 110.75 | 106.09 | 102.41 |
| Low-T HF SIO2 | | | 80.91 | 139.51 | 150.5 | 144.91 |
| Low-T LF SINx | | | | 113.09 | 103.45 | 105.91 |
| Low-T HF SIO2 | | | | 159.61 | 148.17 | 143.01 |
| Low-T LF SINx | | | | 79.09 | 112.14 | 104.03 |
| Low-T HF SIO2 | | | | 81.93 | 139.13 | 149.8 |
| Low-T LF SINx | | | | | 114.94 | 102.88 |
| Low-T HF SIO2 | | | | | 159.85 | 146.39 |
| Low-T LF SINx | | | | | 79.9 | 111.89 |
| Low-T HF SIO2 | | | | | 82.92 | 138.85 |
| Low-T LF SINx | | | | | | 113.74 |
| Low-T HF SIO2 | | | | | | 160.82 |
| Low-T LF SINx | | | | | | 77.88 |
| Low-T HF SIO2 | | | | | | 83.26 |

| Sequence | Material | Thickness (nm) |
|---|---|---|
| 1 | AL | 135.44 |
| 2 | SIO2 | 86.77 |
| 3 | SI3N4 | 74.64 |
| 4 | SIO2 | 101.89 |
| 5 | SI3N4 | 75.8 |
| 6 | SIO2 | 105.81 |
| 7 | SI3N4 | 75.17 |
| 8 | SIO2 | 106.31 |
| 9 | SI3N4 | 77.02 |
| 10 | SIO2 | 107.31 |
| 11 | SI3N4 | 77.07 |
| 12 | SIO2 | 109.74 |
| 13 | SI3N4 | 80.74 |
| 14 | SIO2 | 115.24 |
| 15 | SI3N4 | 85.06 |
| 16 | SIO2 | 122.07 |
| 17 | SI3N4 | 88.82 |
| 18 | SIO2 | 121.35 |
| 19 | SI3N4 | 87.35 |
| 20 | SIO2 | 121.62 |
| 21 | SI3N4 | 90.29 |
| 22 | SIO2 | 127.45 |
| 23 | SI3N4 | 93.68 |
| 24 | SIO2 | 129.7 |
| 25 | SI3N4 | 94.4 |
| 26 | SIO2 | 128.94 |
| 27 | SI3N4 | 93.66 |
| 28 | SIO2 | 134.06 |
| 29 | SI3N4 | 99.64 |
| 30 | SIO2 | 134.17 |
| 31 | SI3N4 | 93.87 |
| 32 | SIO2 | 133.16 |
| 33 | SI3N4 | 103.59 |
| 34 | SIO2 | 142.17 |
| 35 | SI3N4 | 93.56 |
| 36 | SIO2 | 132.17 |
| 37 | SI3N4 | 122.06 |
| 38 | SIO2 | 129.87 |
| 39 | SI3N4 | 74.78 |
| 40 | SIO2 | 89.33 |

Fig. 8

| Number of layers (inc. Al) | Reflectance in range 450-650nm | Phase shift in range 450-650nm | | Total thickness except Al (nm) |
|---|---|---|---|---|
| | | Max | Min | |
| 30 | 88%-99.4% | 120° | 80° | 3132 |
| 34 | 87%-99.6% | 108° | 80° | 3614 |
| 38 | 85%-99.6% | 108° | 84° | 4362 |
| 42 | 85%-99.7% | 105° | 82° | 5080 |
| 46 | 82%-99.7% | 105° | 83° | 5166 |
| 50 | 82%-99.7% | 107° | 82° | 5572 |

OPTICAL APPARATUS AND METHODS AND COMPUTER PROGRAM PRODUCTS USEFUL FOR MANUFACTURING SAME

REFERENCE TO CO-PENDING APPLICATIONS

Priority is claimed from "Optical Polarization Apparatus", U.S. Ser. No. 62/542,819 filed Sep. 8, 2017, the disclosure of which application is hereby incorporated by reference.

FIELD OF THIS DISCLOSURE

The present invention relates to the field of MEMS and more particularly to micro-mirrors inter alia.

BACKGROUND OF THIS DISCLOSURE

A HWP or a QWP is typically provided by using off-the-shelf components as part of the optical system. Examples of such components include:
www.edmundoptics.com/optics/polarizers/waveplates-retarders/precision-achromatic-waveplates-retarders/
www.thorlabs.com/newgrouppage9.cfm?objectgroup_id=10053

These Precision Achromatic Waveplates (Retarders) include a polymer stack layered between two precision BK7 windows, and are available in standard $\lambda/4$ and $\lambda/2$ options for common visible and MR wavelengths. These waveplates (retarders) will experience less than 1% retardance change over a $\pm 10°$ angle of incidence. Each Precision Achromatic Waveplates (Retarders) is mounted in a metal ring with the fast axis clearly marked.

Wikipedia describes that "A distributed Bragg reflector (DBI) is a reflector used in waveguides, such as optical fibers. It is a structure formed from multiple layers of alternating materials with varying refractive index, or by periodic variation of some characteristic (such as height) of a dielectric waveguide, resulting in periodic variation in the effective refractive index in the guide. Each layer boundary causes a partial reflection of an optical wave. For waves whose vacuum wavelength is close to four times the optical thickness of the layers, the many reflections combine with constructive interference, and the layers act as a high-quality reflector." It is known that a stack of alternating dielectric layers can achieve nearly total reflection within a range of frequencies e.g. a central wavelength of x nanometer with a stopband of y nanometer (e.g. 50 or 100 or 150 or 180 or 200 or 300 nanometers).

State of the art technologies are described in the following publications and documents:

U.S. Pat. No. 5,315,429(A) describes an optical system that can replace the QWP coating, which is not a MEMS device (Micro Mechanical device).

US2010265467(A1) describes a polarization diversity element added to a projection system.

U.S. Pat. No. 7,859,752(B2) describes "beam circulation", with 2 separated mirrors and is not a MEMS device.

U.S. Pat. No. 6,088,163(A) describes a multi-layer mirror, with no reference to QWP and is based on polymer coating.

WO9517691(A1) describes an optical device (Optical polarizer) generated by bonding of 2 other devices and is not implemented on a MEMS device or micro mirror. U.S. Pat. No. 7,113,337(B2) describes creating an amsotropy structure.

The following link: www.osapublishing.org/abstract.cfm?URI=CLEO_Apps-2010-AFB4 is a paper which discusses issues unique to coating MEMS devices and describes design changes which may be used to coat a deformable mirror with 99.9% reflective dielectric coatings at 532 nm.

The following link: Anti-Stiction Coatings for High Reliability MEMS www.surmet.com/docs/(1)Article_MEMS.pdf describes anti-stiction coatings for high reliability mems devices and relates to micromirrors inter alia.

U.S. Pat. No. 7,009,745B2 describes a Coating for optical MEMS devices, as does the following patent document: US20040136044A1.

The following link: Advanced optical coatings of a segmented MEMS DM www.researchgate.net/profile/Michael_Helmbrecht/. describes optical coatings of a segmented MEMS device and relates inter alia to deformable mirrors.

The disclosures of all publications and patent documents mentioned in the specification, and of the publications and patent documents cited therein directly or indirectly, are hereby incorporated by reference.

SUMMARY OF CERTAIN EMBODIMENTS OF THE INVENTION

Certain embodiments seek to add use-case required optical properties to a mems device e.g. micro-mirror. One possible use case could be supporting the option of using a laser beam incident angle of 0° (vertically to the mirror) e.g. in a pico-projector or other laser beam scanning system.

Certain embodiments seek to provide a typically continuous, multi-layer structure or stack including e.g. interspersed tensile and compressive layers, e.g. for the above purpose.

Certain embodiments seek to implement a QWP or HWP on a mechanical structure. Certain embodiments seek to implement an active optical e.g. QWP or HWP coating on a specific mechanical structure (e.g. continuous multi-layer structure), namely a MEMS scanning micro-mirror where the coating adds use-case required optical properties to the structure on which the coatings are deposited.

Certain embodiments seek to provide laser based scanning devices, which utilize a scanning mirror surface as a substrate to construct a polarization apparatus, e.g. a Quarter Wave Plate. As a result, the laser beam is shaped while traveling through the scanning system without the need for additional components, and system performance is improved.

Certain embodiments seek to improve optical devices which make use of coherent light sources, hence need to achieve polarization of the light, from the source, impinging on the device.

Certain embodiments seek to provide an active optical element in addition to a given passive optical element (which may be MEMS and may be moving and may be a mirror and may be all three, e.g. a moving micro-mirror) by depositing optical coatings providing the active optical properties on a substrate which provides passive optical properties e.g. reflectivity, rather than by adding an active optical element additional to and separate from the passive optical element.

The resulting mems device may be of the order of one mm in size e.g., say, only 2 mm×2 mm in size, and may nonetheless bear a dozen or a couple of dozen or at least three dozen layers, in contrast to state of the art mems devices, which do not have so many layers.

Certain embodiments seek to provide an improved Bragg Reflector with QWP, using any of the methods or systems shown and described herein.

At least the following embodiments are provided:

Embodiment 1. Optical apparatus comprising:

a MEMS substrate having a surface; and a stack of optical coatings which is deposited on the MEMS substrate's surface and which modifies at least one property of light impinging on the stack.

thereby to generate an active optical device on board a passive optical element.

An active optical device or element is an optical device or element (e.g. qwp, filter), which changes a light property of incoming light impinging on the device or element, such that the incoming light's properties are not identical to the outgoing light's properties (the properties of light exiting the device).

In contrast a passive optical device or element is an optical device or element (e.g. Mirror, attenuator), which does not change any light property of incoming light impinging on the device or element, such that the incoming light's properties are identical to the outgoing light's properties (the properties of light exiting the device e.g. Reflecting off the mirror).

For the purposes of the above definitions, the term "light property" may include or may consist of the following properties: wavelength (=frequency), and/or polarity whereas the light's intensity or amplitude is not considered a property of the light.

Embodiment 2. Apparatus according to any of the preceding embodiments wherein the optical coatings are configured to provide qwp properties to the substrate.

Embodiment 3. Apparatus according to any of the preceding embodiments and wherein the substrate comprises a passive optical element such as a mirror, filter, or semi-mirror.

Embodiment 4. Apparatus according to any of the preceding embodiments wherein the substrate comprises a mirror and wherein the stack of optical coatings when deposited on the mirror, reflects light, having wavelength in a given range and impinging on the stack at at least one angle, and also modifies at least one property of the light impinging at the at least one angle, thereby to generate reflected light which differs in at least one property from the light impinging at the at least one angle.

Embodiment 5. Apparatus according to any of the preceding embodiments wherein the optical coatings are configured to provide hwp properties to the substrate.

Embodiment 6. Apparatus according to any of the preceding embodiments wherein the property comprises polarity.

Embodiment 7. Apparatus according to any of the preceding embodiments wherein the substrate comprises a mirror within a scanning subsystem. Embodiment 8. Apparatus according to any of the preceding embodiments wherein Chemical vapor deposition (CVD) is used to deposit the coatings on the substrate.

The cvd machine is typically built to accommodate big workpieces and therefore, (a multiplicity of) small substrates may be placed on holding plates e.g. carriers, of a size the machine can accommodate.

Embodiment 9. Apparatus according to any of the preceding embodiments wherein the given range comprises a visible light range.

Embodiment 10. Apparatus according to any of the preceding embodiments wherein the stack modifies at least one property of the light at least in a given range.

Embodiment 11. Apparatus according to any of the preceding embodiments wherein at least one of the 2 dimensions of the mems substrate's surface is less than 10 mm in length.

Embodiment 12. A method for manufacturing optical apparatus comprising:

providing a MEMS substrate having a surface; and depositing on the MEMS substrate's surface a stack of optical coatings which when so deposited, modifies at least one property of light impinging on the stack.

A suitably programmed processor may be employed to control the depositing operation.

Embodiment 13. A method according to any of the preceding embodiments and wherein the optical coatings are pre-tested to ensure that when the optical coatings are deposited on the mems substrate, the mems substrate does not break.

Embodiment 14. A method according to any of the preceding embodiments and wherein the optical coatings are pre-tested to ensure that when the optical coatings are deposited on the mems substrate, the mems substrate does not bend.

Embodiment 15. A method according to any of the preceding embodiments and also comprising designing plural stacks of optical coatings to perform a given modification on light of a given wavelength, where the optical coating for each stack includes a given predetermined number of layers, thereby to generate a range of stacks extending from a first stack with relatively few layers hence applying relatively small stress on the mems substrate whose optical characteristics are relatively poor to a last stack with relatively many layers hence applying relatively large stress on the mems substrate whose optical characteristics are relatively good; and selecting a first one of the plural stacks which answers to first mechanical and optical requirements for a first use case, and manufacturing a first run of optical devices accordingly.

The mechanical requirements include operating conditions (e.g. Specification of the mems substrate itself in terms of size or material, and/or or specification of the mems substrate's motion) under which the mems substrate must not bend or break once a stack of optical coatings has been deposited thereupon.

The optical characteristics include desired reflectivity (of a mirror substrate) to be achieved in a given use case (e.g. 95% reflectivity) and/or polarity (of light which has impinged on the stack) to be achieved in the given use case.

Stacks may be designed using conventional optical design software.

Embodiment 16. A method according to any of the preceding embodiments and also comprising selecting a second one of the plural stacks which answers to second mechanical and optical requirements for a second use case and manufacturing a second run of optical devices accordingly.

Embodiment 17. Apparatus according to any of the preceding embodiments wherein the given range comprises at least one of the following: a visible light range, a uv light range, an NIR light range, an NIR light range, a SWIR light range.

Embodiment 18. Apparatus according to any of the preceding embodiments wherein the scanning subsystem includes a gimballed mounting for the mirror.

Embodiment 19. Apparatus according to any of the preceding embodiments wherein Plasma Enhanced Chemical vapor deposition is used to deposit the coatings on the substrate.

The term mems (i.e., "micro-electro-mechanical-system") is used herein to include electro-mechanical systems having at least some components whose dimensions are of the order of magnitude of single microns.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may he written in any conventional progranimi ng language, and optionally a machine for executing the program such as but not limited to a general purpose computer which may optionally be configured or activated in accordance with the teachings of the present invention.

The embodiments referred to above, and other embodiments, are described in detail in the next section.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating," "selecting", "ranking", "grading", "calculating", "determining", "generating", "reassessing", "classifying", "generating", "producing", as "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

Terms used in the specification and claims may be construed either in accordance with any definition thereof appearing in the prior art literature or in accordance with the specification.

BRIEF DESCRIPTION OF THE DRAWINGS

Certain embodiments of the invention are illustrated in the following drawings:

FIGS. 1a-1c are simplified flowchart illustrations of methods provided in accordance with certain embodiments which may be provided either stand-alone or in any suitable combination with each other, or with any other embodiment described or illustrated herewithin.

FIGS. 6a and 6b ate tables useful in understanding certain embodiments.

FIGS. 7b and 8 are tables useful in understanding certain embodiments.

DETAILED DESCRIPTION OF CERTAIN EMBODIMENTS

Figure 2:
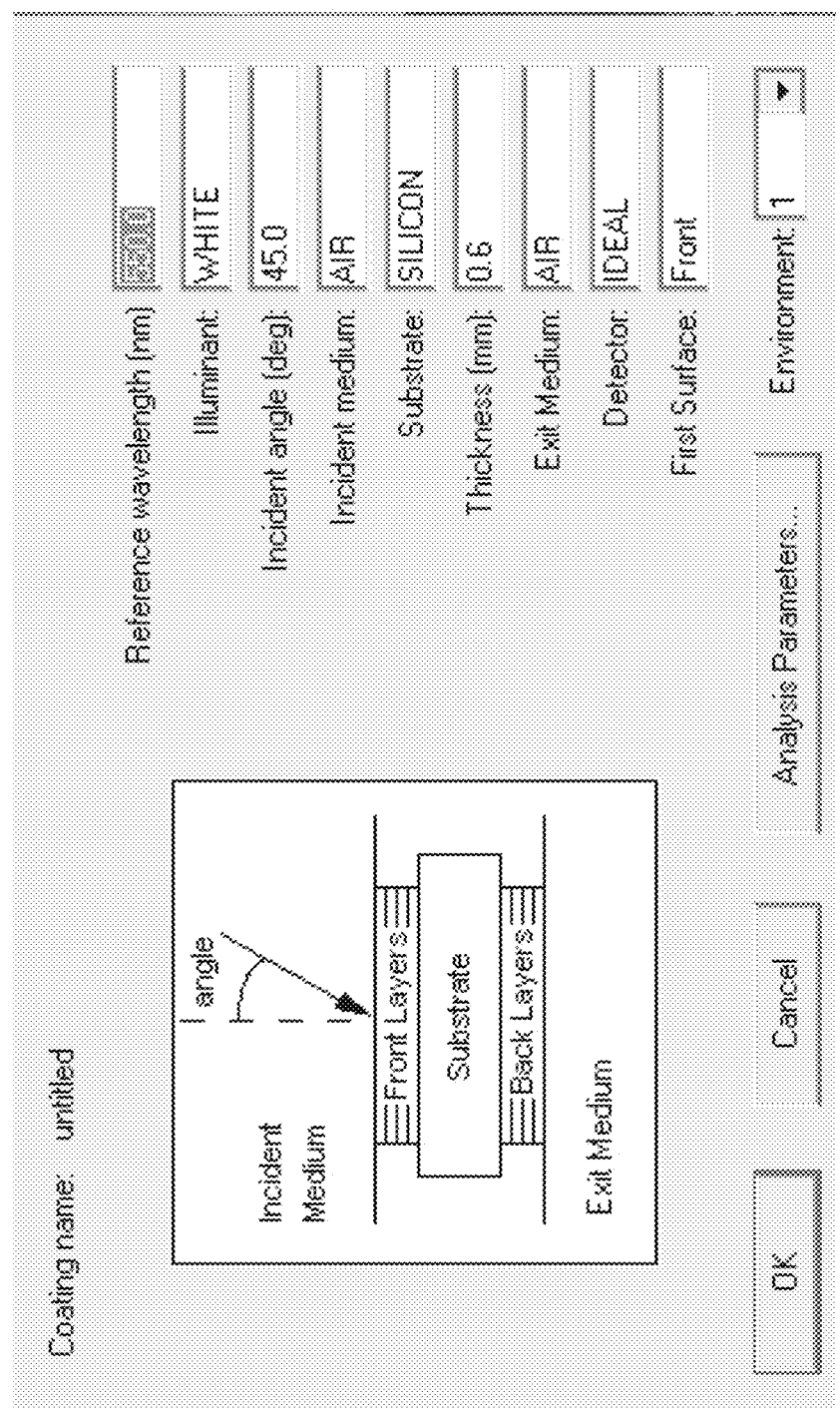
FIG. 2 illustrates design description for a QWP based on Metal.
Figure 3A:
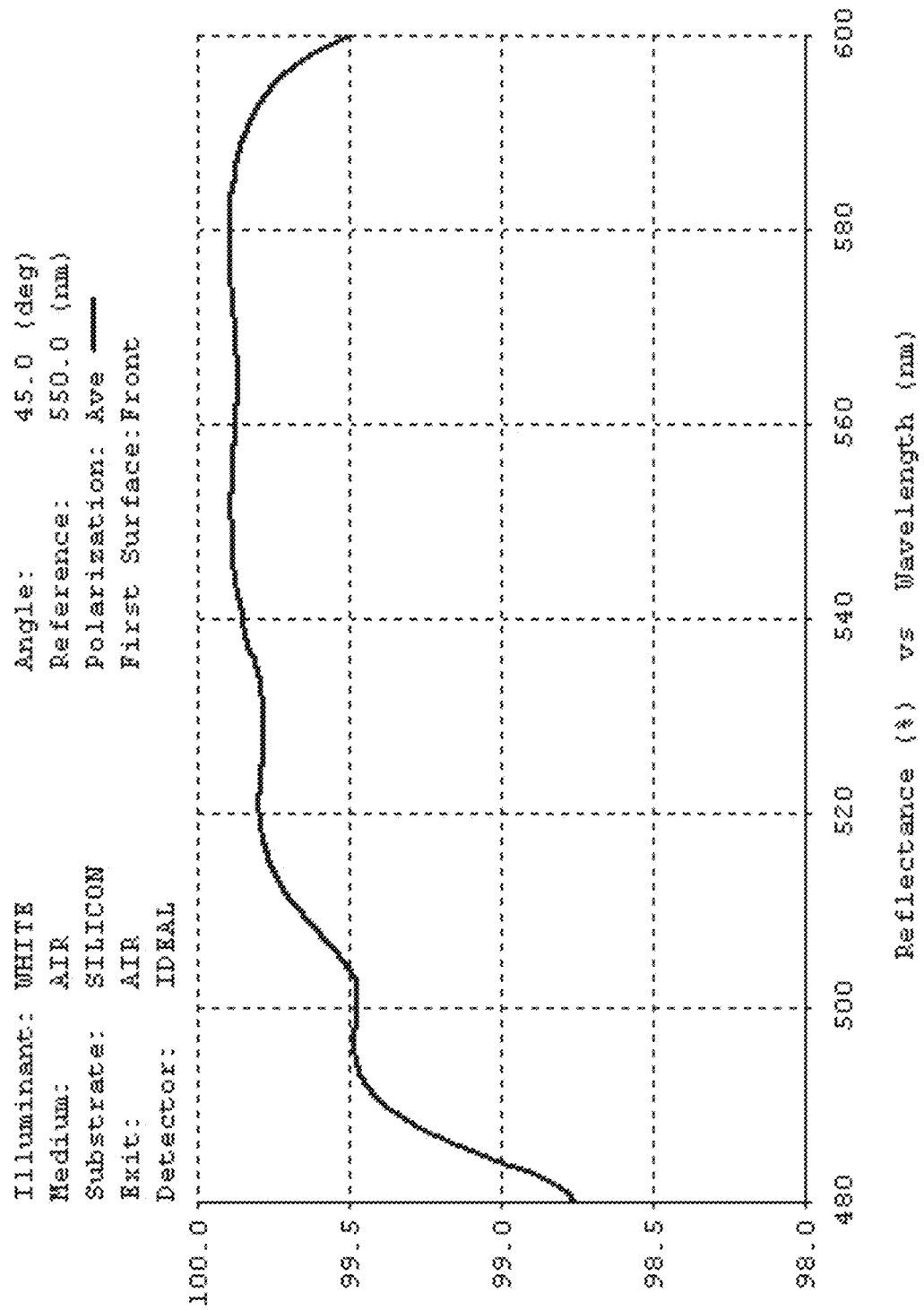
FIG. 3a illustrates Reflectance vs Wavelength for a QWP based on Metal.
Figure 3B:
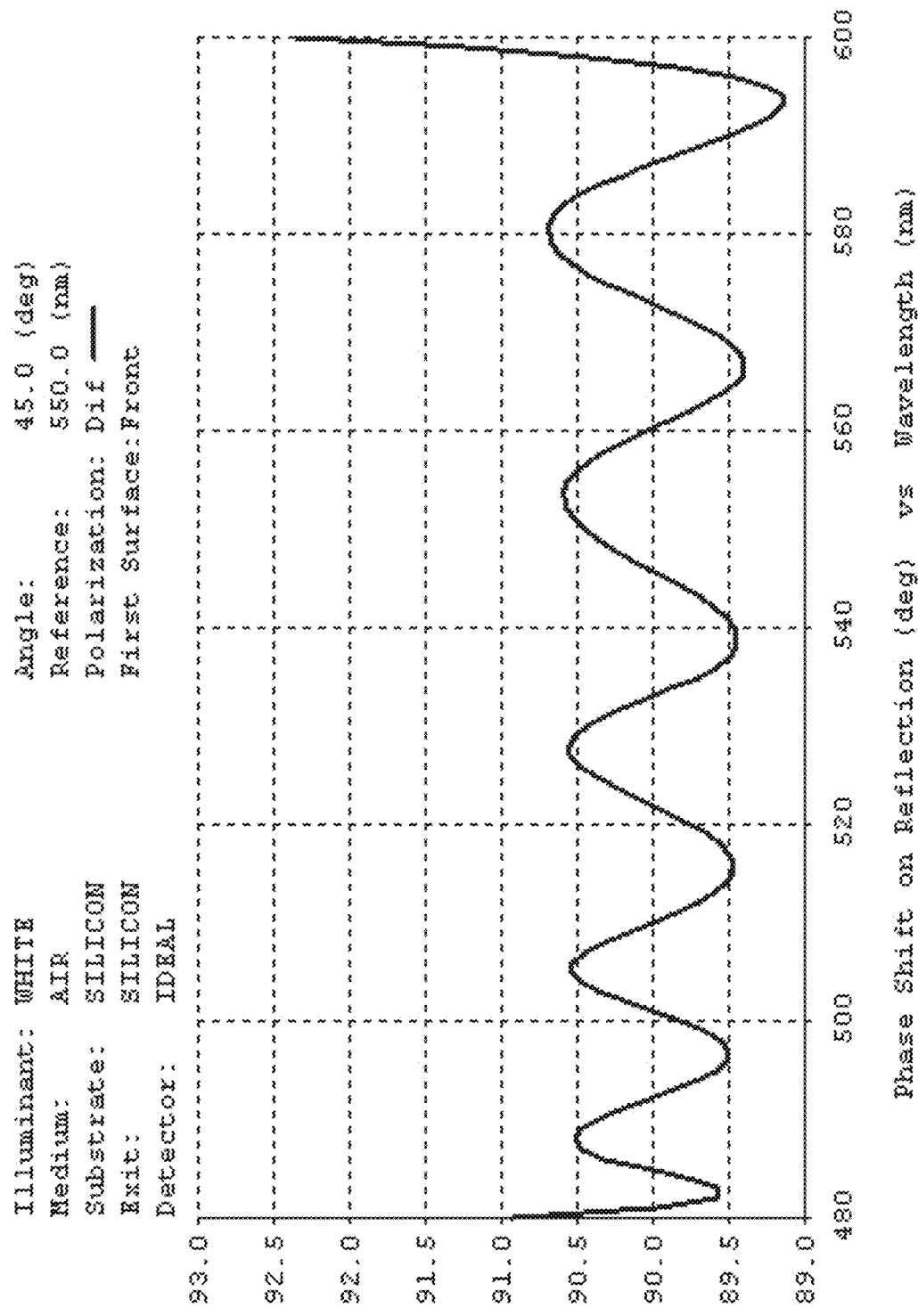
FIG. 3b is a graph of Phase difference (°) vs Wavelength (nm) for a QWP based on Metal.
Figure 4:
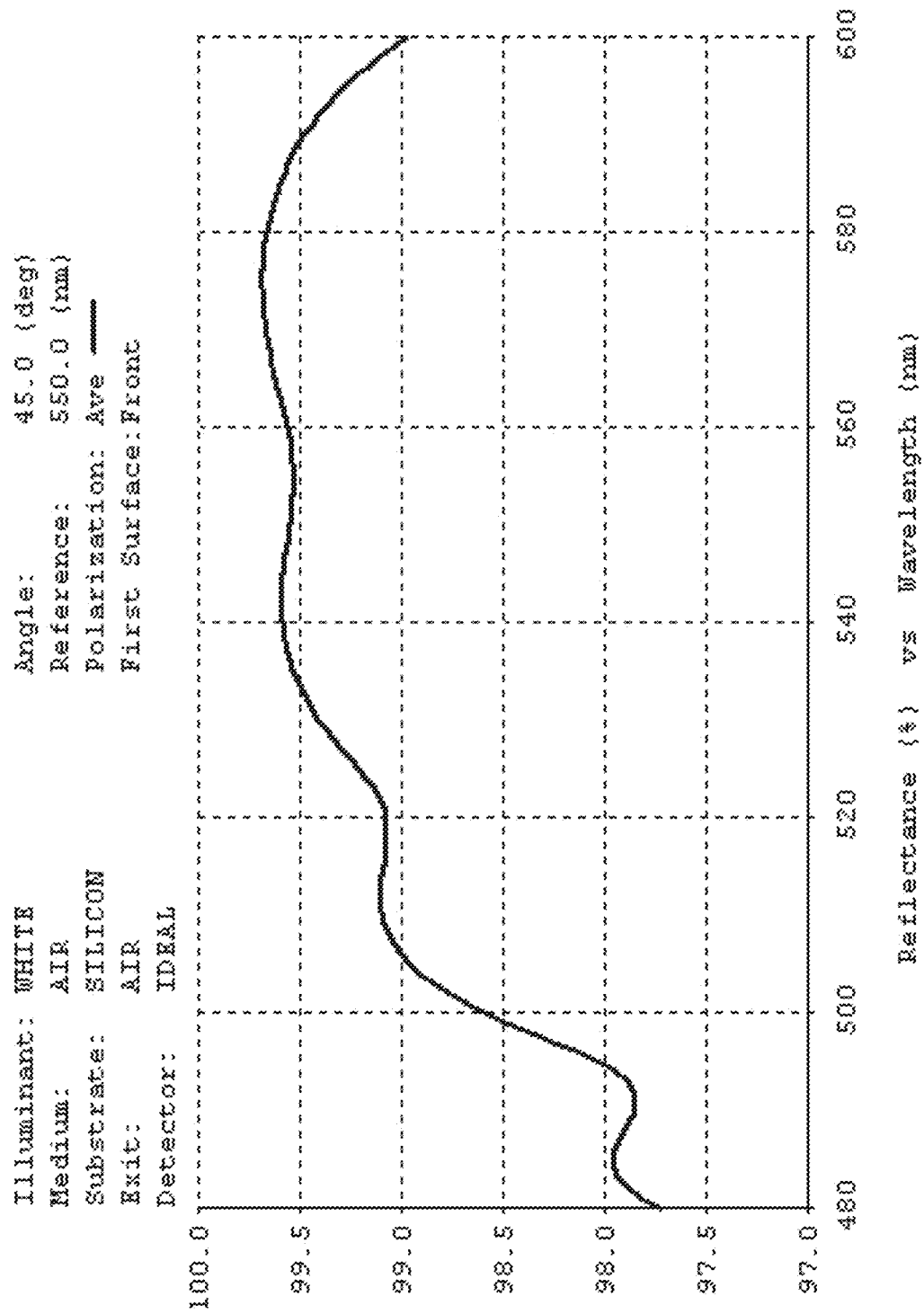
FIG. 4 is a graph of Reflectance vs Wavelength for a QWP based on Al and Oxide layers.
Figure 5:
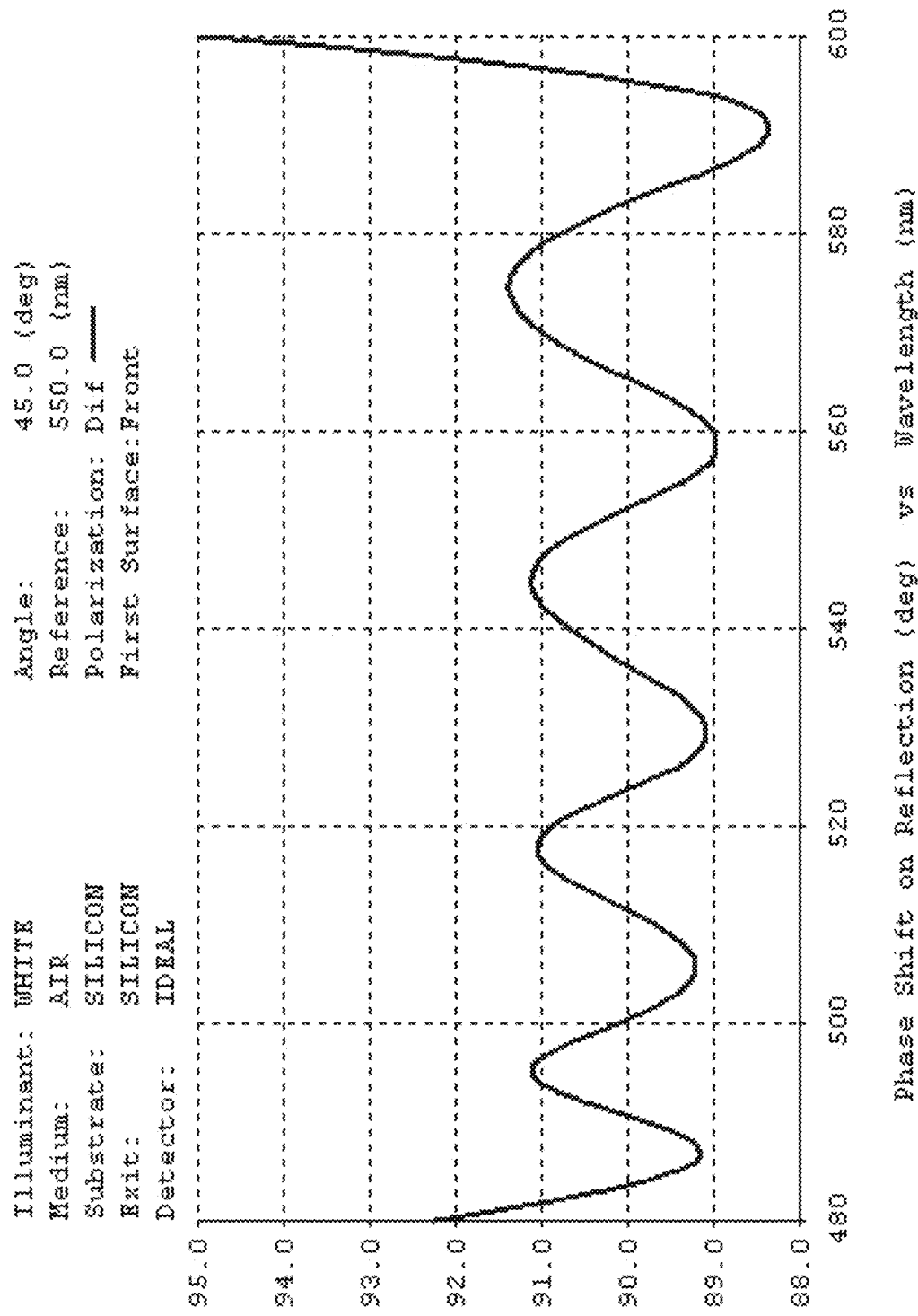
FIG. 5 is a graph of Phase difference (°) vs Wavelength (nm) for a QWP based on Metal.

Referring now to FIGS. 2-5 which illustrate certain aspects by way of example, a waveplate is an example of an active optical device because it alters a characteristic (the polarization state) of a light wave travelling through the waveplate. Types of waveplates include HWP—Half Wave Plate, which shifts the polarization direction of linearly polarized light; and QWP—Quarter Wave Plate, which converts linearly polarized light into circularly polarized light, and vice versa. A quarter-wave plate can be used to produce elliptical polarization as well.

Conventional waveplates may be constructed of a birefringent material (such as quartz or mica), for which the index of refraction is different for different orientations of light passing through it. The behavior of a waveplate (that is, whether it is a half-wave plate, a quarter-wave plate, etc.) depends on the thickness of the crystal, the wavelength of light, and the variation of the index of refraction. By appropriate choice of the relationship between these parameters, it is possible to introduce a controlled phase shift between the two polarization components of a light wave, thereby altering its polarization.

Changing the polarization phase helps to modify and control property of the polarization, which can influence the focus of laser beams, cut-off wavelengths of filters, and can be important to prevent unwanted back reflections. Light passing through a low-order waveplate will undergo a low number of full or partial wavelength shifts (also referred to as the order, or m) in addition to fractional design retarda.nce. This differs from true zero-order and multi-order waveplates which undergo no shift or a high number of shifts, respectively. The low-order design maintains near zero-order performance making it a good alternative to a true zero-order waveplate.

Some use-cases or applications involve altering an existing polarization of an optical system in order to improve its performance. Two examples of such are as follows:

A. Laser typically has horizontal polarization. If it is desired to reflect the laser on a metal mirror, the laser polarization is changed to a vertical polarity (e.g. since a metal mirror works best with vertically polarized light). This can be done using HWP.

B. Passing a linearly polarized laser through a QWP mirror at any angle besides 45° will cause the beam to be elliptically polarized.

Conventionally, a IMP or a QWP is provided by using off-the-shelf components as part of the optical system. However, these components are large and bulky and add additional significant cost to the optical system.

Certain embodiments seek to provide an optical active component e.g. of an HWP and/or QWP provided as part of other optical components of the optical system.

Certain embodiments seek to provide a new paradigm in a polarization apparatus or other active optical elements, e.g. for laser based scanning systems or other use-cases.

Certain embodiments seek to provide an efficient and simple way to polarize or otherwise modify at least one characteristic of a scanned laser beam.

An optical device e.g. for polarizing lasers on a scanning mirror device may comprise
 a) a scanning mirror; and
 b) a coated layer, whose polarization depends on the refractive index and/or propagation direction of light.

The optical polarization apparatus and scanning mechanism may be operative for shaping laser light beams for scanning systems, providing good performance with respect to known state-of-the-art solutions, while reducing the cost and complexity of such solutions, and enhancing the performance of the image itself.

The simplest way for a waveplate to be part of a scanning element is to manufacture a phase retarder made by a metal layer e.g. as described herein e.g. because the scanner based on a metal layer has high reflectance and large phase difference between p and s polarizations. However, this kind of a scanner may only have phase retardation in a narrow wavelength interval. Furthermore, only a particular phase may be achieved by an incident angle using such device. However, a combination of metal and dielectric film could improve its performance of phase retardation.

An example of such a metal based phase retarder could be by using Ag (Silver), Si3N4 and SiO2. The design parameters for this example may be:
 Incident angle: 45°
 Wavelength region: 480-600
 Substrate: Silicon
 Thickness of substrate: 600 μm Since the layer being deposited on the mirror will be a "birefringent" layer (e.g. the refractive index depends on the polarization and propagation direction of light), two indexes of refraction (one perpendicular to the optic axis, and the second parallel to the optic axis) are obtained. Since each polarization component speed (travelling through coated layer) depends on the refraction index, phase difference between the two components may be created (as they depend on the different refraction index). The phase difference can create a circular beam.

Figure 7A:
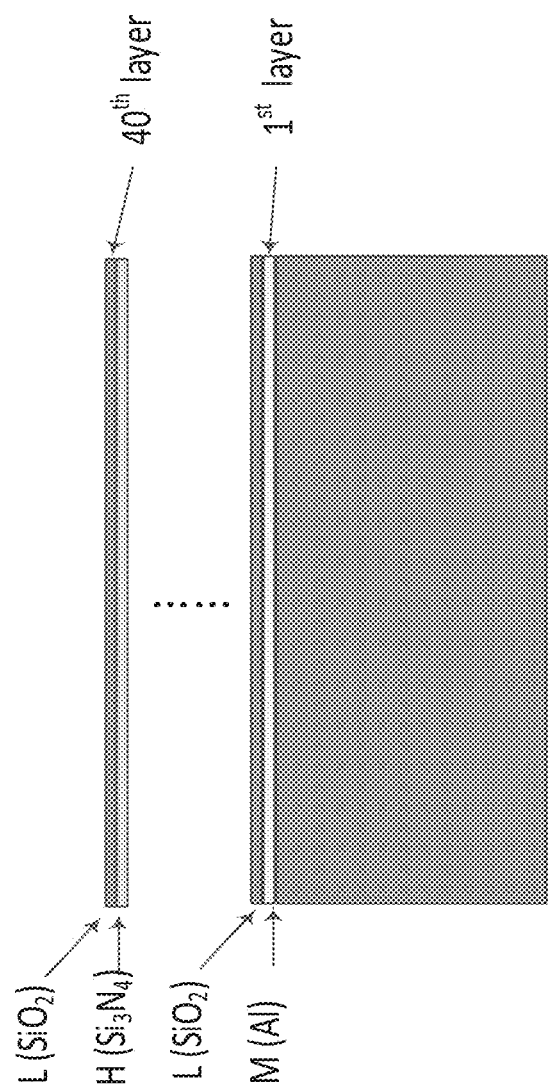
FIG. 7a is a diagram of an example optical device having optical layers.

Another example of such a phase retarder e.g. as shown in FIG. 7a could be by using Al (Aluminums), Si3N4 and SiO2. The design parameters for this example may be:
 Incident angle: 45°
 Wavelength region: 480-600
 Substrate: Silicon
 Thickness of substrate: 600 μm Embodiments include a tilted optical polarization apparatus comprising: a scanning mirror device with an engineered optical coating thereon, with polarization which depends on the refractive indexes and propagation direction of light as desired by at least one use-case, and more typically by each of many use-cases each of which requires a set of n instances of the scanning minor device. The device may be operative to perform quarter waveplate polarization (QWP) or linear waveplate polarization (HWP). The device may be formed of different materials such as, but not limited to: Silicon, Ceramic, Al2O3, etc., depending on system requirements for functionality and cost of the optical device. The device's optical coating may be formed of different materials such as, but not limited to: Al, Ag, Si3N4 and SiO2.

An example of a high refractive material is Si3N4 L. An example of a low refractive material is SiO2. M may be used to signify a metal layer e.g. of aluminum or silver. Design may be specific to an incident angle e.g. 45°. The substrate may be silicon having a given thickness e.g.: 600 micrometer. The optimization region may be 450-650 nm and the plotted region may be 400-700 nm.

Example: given Si, a bare silicon reference. 3 QWPs may be designed e.g.:
 QWP_A: Aluminum+39 dielectric layers, total thickness of dielectric stack 4196 nm (QWP_A_Al_40L)
 QWP_B: Aluminum+49 dielectric layers, total thickness of dielectric stack 5672 nm (QWP_B_Al_50L)
 QWP_C: Silver+35 layers, total thrickness of dielectric stack 4004 nm (QWP_B_Al_36L).

A reflectance simulation may be run, yielding % reflectivity vs, wavelength graphs for a range of wavelengths e.g. between 400 and 700 nm, for each of the 3 QWPs and of the bare silicon. Delta Simulation may be computed as differences between the respective QWPs and the silicon. Spectroscopic ellipsometry may also be plotted, for each of the 3 QWPs and for the silicon.

Eventually, one of the three stacks (e.g. stack c) is selected, and the stack of layers or coating is then deposited on mirrors.

FIG. 1a (aka flow a) is a simplified flowchart illustration of a method to pre-select layers that provides a given mirror with a given optical coating. This flow may include all or any subset of the following operations 1, 2, ..., suitably ordered e.g. as shown:

1. Characterization of the MEMS mirror (flatness, radius of curvature). This may be used for stress analysis to determine the effort needed to ensure the mirror is flat after the process, rather than being deformed by the tensile/compressive stress of the layers. Typically, stress does not impact a layer's optical properties, but may impact the layer's reliability (e.g, causing the layer to crack and peel off) and/or the mirror's overall optical flatness.

2. Characterization (thickness calibration of layers deposited on the wafer, Refractive Index) of 2 materials, A and B, typically one with a relatively high refractive index, and the other with a relatively low RI (Refractive Index), from which to form the deposit layers (e.g. A=SiNx, B=SiO2).

It is appreciated that both of the two typically different dielectric materials may be conventionally engineered to be tensile or compressive.

Generally, optical simulation software may be used to determine the layer thicknesses and the materials. The software may recommend plural options (e.g. those presented in the table of FIGS. 6a 6b and the table of FIG. 8) and the option which provides highest reflection from among the options that are thin enough for a given use-case (e.g. application, specification) may be selected. Or, the option which is thinnest, from among those which provide acceptably high reflectivity for a given use-case (e.g. application, specification) may be selected.

3. Simulation: Based on operation 2, perform optical analysis for a 10 layer (say) filter (e.g. QWP or IMP) including 5 layers formed of material A and 5 layers formed of material B. Do the same for (say) a 20 layer filter (10 layers each of A, B), and for a 30 layer, 40 laver, 50 layer, ... and 100 layer filter.

These simulations yield optical behavior (e.g. reflectivity and/or optical polarity) for each of the L layer filters (e.g. QWP or MVP) analyzed (where L runs, say, from 10 to 100 with an increment of 10 layers in between).

4. Physical validation of simulation, typically for only a subset of the simulated filters; typically initially validate using a workpiece (e.g. silicon wafer) which is much larger e.g. at least an order of magnitude larger, than the contemplated mirror, since it is difficult to measure the optical property of a very small deposit mirror, and easier to measure a workpiece selected to be large enough to measure using given equipment.

For example,

4*a*. Based on the optical behavior (reflection, thickness, optical polarity. LDT), select a subset of filters e.g. 5 filters (for example the filters having respectively 10 layers, 30 layers, 40 layers, 70 layers, 80 layers).

4*b*. For each filter in the subset, run the full stack of layers (all layers) in the coating machine (e.g. PECVD, Ion beam sputtering) on a Si wafer (or whatever substrate material is being used for the MEMS mirror).

Measure the outcome results and plot optical outcome graph or reflection vs wavelength graph, using a suitable software measuring tool.

5. Tuning of the model:

Compare real results measured in operation 4, with optical model (e,g. stack of layers) generated in operation 3, and tune the model to reflect the real results.

Tuning may, for example, include changing the process temperature and/or changing the thickness of layers and/or changing deposition parameters.

Comparing may include comparing spectral graphs (reflection vs. wavelength) e.g. comparing a simulation graph of a model with a real measured graph, 6. Based on a pre-defined trade-off between total layer thickness and optical performance, choose "optimal" filter from the subset offilters, which has good optical performance, yet is not too thick e.g. the stress level engendered by the thickness of the layers is not too great for the mirror to bear; it is appreciated that the mirror's thickness may be in the order of only dozens of micrometers e.g. the mirror may, say, be 90 um thick, hence sensitive to the stress caused by too many deposited layers. Nonetheless, results have been surprisingly positive in providing both an acceptable reflectivity and a thickness (level of stress) that the micromirror is capable of tolerating.

It is appreciated that in the description herein, the terms "optical behavior", "outcome results", "optical performance", and "optical properties" may include all or any subset of: reflection, thickness, optical polarity (or phase shift), LDT.

7. Physical validation using an actual mirror as the workpiece being coated: Coat mirror (wafer) with the number of layers that the "optimal" filter has e.g. using flow b below. Typically, operation 7 is done on wafer (in the pre-testing phase) and also on a small (e.g. 2 cm×2 cm) Si sample of a size that the measurement tool is able to work on.

FIG. 1*b* (aka flow b) is a simplified flowchart illustration of a method by which to coat a micromirror with optical coating selected in flow a. This flow may include all or any subset of the following operations, suitably ordered e.g. as shown:

10: provide MEMS mirror to be coated e.g. Maradin's MAR1100>2D Scanning Mirror, MAR1500>1D Scanning Mirror (1.5mm), MAR1800S>1D Scanning Mirror (3.6×4.7 mm), MAR1800L

20: Provide a "hard mask" formed e.g. from Si or metal, to add optical coating to the mirror, typically for use at die level (e.g. after wafers are diced to singulated dies rather than before), or alternatively at wafer level.

30: Align the hard mask formed in operation 20, to the WAIS die (e.g. MEMS mirror of operation 10) e.g. under a microscope, A method for optical coating mask alignment is now described in detail. The method provides aligning of an optical coating hard mask to a substrate e.g. die e.g. MEMS die e.g. the die of Maradin's commercially available scanning mirror. First, Si hard masks and a MFMS die may be provided by the manufacturer of the substrate e.g. die. An Si carrier wafer, say, may be used for mounting the dies e.g. by placing the MEMS die on the Si carrier wafer. The Si hard mask may then be placed on the MEMS die with the mask's oxide-covered side touching the MEMS die. Then, the Si hard mask may be placed on the MEMS die including performing gross (typically manual) alignment e.g. to ensure that the Si hard mask is covering the MEMS die. Attach one side of the Si hard mask e.g. using a suitable glue or Kapton tape which may be used to attach the Si hard mask to the Si carrier wafer.

Kapton tape may also be used to attach the second side of the Si hard mask to the carrier wafer. Using a sharp tool under a microscope, the MEMS die may be pushed under the Si hard mask including performing microscopic-level alignment of the MEMS die with the Si hard mask.

40: Attach the aligned mask to the MEMS die or wafer, and (if working at die level), to a carrier wafer.

Conventional coating processes can only be performed on wafers because of the tool setup, and so, to accommodate this, all dies may be attached to the carrier wafer, so that all dies can be coated.

Alternatively, if working at wafer level, there is no need to attach a mask to the carrier wafer.

50: Plasma cleaning of the dies to ensure no organic residuals are trapped under the optical coating.

70: Conventional preparation of the dies for optical coating: (e.g. as per flow c below). Alternatively or in addition, it is appreciated that https://inlint/perform this commercially as a service, using conventional techniques. Other optical coating vendors which design optical layers include casix.com; accucoatinc.com, alluxa.com; and izovac-coatings.com.

80: Apply optical coating e.g. by deposition, using high frequency plasma and low frequency plasma in order to tune each layer's optical property.

Typically, because the MEMS mirror is very small (1 mm), add an "escort" sample e.g. a square Si sample 2 cm×2 cm process on the carrier wafer.

85: Optical inspection of coated mirrors to verify there is no contamination on any mirror. If contamination is found, discard that mirror.

90: Disassemble mirrors from carrier wafer.

100: Test "escort" sample: measure the layer property (e.g. reflectance/polarity/thickness on the sample), and ensure the QWP is working.

110: Conduct LDT (Laser Damage Threshold) test to verify that the mirror can withstand high laser power, and that the mirror has a stable coating (it is appreciated that measurements typically cannot be performed on the mirror because of the optics required to collimate the laser to impinge on the mirror; the laser spot size may be bigger than the mirror. If the LDT test fails, tune the process es. by modifying deposition temperature and/or number of layers and run the process again, using the new deposition parameters (temperature, layer thickness). Typically, first flow A is re-run to test the process performance and confirm a suitable reflection/polarity, and only after desired performance has been confirmed, the mirror itself is re-run (e.g. as per flow B). LDT may be performed using a standard protocol.

FIG. 1*c* (aka flow c) is a simplified flowchart illustration of an example layer development method which may be used for performing the "Preparation for optical coating"

operation 70 in flow b. This flow may include all or any subset of the following operations, suitably ordered e.g.: as shown:

210: Calibrate SiNx layer by depositing the layer e.g. on Si wafers and measuring all or any subset of: RI (Refraction Index), thickness of the layer and stress of the layer. RI being a physical parameter independent of thickness may be changed by changing deposition parameters (e.g. temperature of chamber, frequency of plasma in a PECVD (Plasma Enhanced Chemical Vapor Deposition) process.

220: Calibrate SiO2 layer by depositing the layer and measuring RI (Refraction Index), thickness of the layer and stress of the layer.

230:1 Perform optical modeling using optical software such as Zemax and inputting the RI and layers thickness (e.g. SiNx & SiO2) e.g. as measured in operation 4 above.

It is appreciated that Zemax virtual prototyping software (or similar) may be used to simulate optical per of the entire product and/or may be used for optimization including using different materials or making one surface do what two surfaces did previously, e.g. by integrating the Zemax opticStudio and the Zemax lensMechanix, or other optical design systems with ray-tracing tools which may be integrated with software determining if mechanical issues have impacted the optical performance, using a Cad platform es., thereby to yield fast and accurate designs for optimechanical products which cut down on the need for generating physical prototypes by generating virtual prototypes which allow design problems to be identified before any physical prototype is built.

240: Deposit several stacks and comparing the results to the optical model. When depositing the material (especially dielectric material), a PECVD tool may be used, which has low frequency (lf)/high frequency (hf) capabilities, in which case it is possible to control or change properties such as the extent to which the layer is tensile or compressive.

250: Tune optical model according to the real result e.g. adjust thicknesses of layers, if and as needed.

260: Run same stacks again and measure.

270: Repeat the deposition, measurement and model tuning operations 240, 250 till required result is obtained.

Typically, thickness calibration (e.g. layer thickness selection) is performed for various numbers of layers, e.g. for 10-100 layers, incrementing by 10 or for 6-42 layers, incrementing by 4, and so forth. Then, stacks may be produced, using the thicknesses that were determined by calibration. Following this, the resulting stacks may be tested, and a determination may be made which of the models (numbers of layers) is best e.g. in terms of a pre-determined tradeoff between thickness & performance. Typically, the selected model has the highest reflectance performance possible, given use-case specific thickness limitations. For example, a given MEMS mirror may be able to bear, mechanically, only a certain maximum total thickness of layers, and/or a moving MEMS device may be incorporated in a given driving subsystem which may or may not be able to accommodate the change in the driving parameters of the mirror required if a particular stack of layers with a particular mass is added. The driving subsystem may include a control loop which is able to cope with the additional layers' change in the device mass, and change the control parameters to handle the new dynamic of the heavier mirror.

Typically, a larger workpiece, which may be just silicon, may be used, e.g. for simulation or testing or measuring, rather than a piece that is the same size as the mirror being developed, because the testing equipment may only be able to work with pieces which are a certain minimum size e.g. ~2×2 cm.

When performing the thickness calibration process, each layer's thickness may be determined or calibrated separately, initially, and full stacks may be deposited accordingly. Following this, quality is determined e.g. by measurement of the curvature of Reflectance vs wavelength where poor results are normally far from the simulation and normally yield low reflectivity in the target wavelength, whereas good results refer to good reflectivity in the target wavelength.

It is appreciated that for each optical coating at least one different stack of layers model may be developed. For example, at least one different stack of layers model may be developed for each of the following, each corresponding to a different order (of set of possible orders) or use-case:

1) Optical coating for a MEMS device impinged upon by light whose wavelength is 905 nm.
2.) Optical coating for a MEMS device impinged upon by light whose wavelength is 700 nm.
3) Optical coating for a MEMS device impinged upon by light whose wavelength is 400-700 nm.
4) Optical coating for a MEMS device impinged upon by light whose wavelength is 1550 nm.

For example, for use-case 1 above, several models may be considered e.g. having one stack (e.g. just a 725 micrometer Si substrate), or, alternatively, 6 alternating layers above that substrate, or alternatively 10 such, or 14 such, or 18 such, or 22 such, or 26 such, or 30 such, or 34 such, or 38 such, or 42 such, yielding 10 models with varying numbers of alternating layers where the alternating layers are pairs of layers where the first layer in the pair (e.g. that lower or closer to the substrate) may be low-t, lf SiNx 122.07 micrometers thick, and the second layer in the pair (e.g. that is further from the substrate) may be low-t, hf SiO2 157.2 micrometers thick.

To give another example, the 40 layers shown in the stack layer diagram of FIG. 7a and in the table of FIG. 7b, may be employed for a QWP, 480-600 nm use-case.

In FIG. 7a, H may comprise a di-electric e.g. high refractive material such as $Si_3N_4$.

L signifies a non-di-electric e.g. low refractive material such as $SiO_2$.

M signifies a metal layer, such as aluminum

Incident angle (e.g. of illumination on medium) may be 45° (or less)-

Substrate: Silicon

Thickness of substrate: 600 μm

Wavelength optimization region: 480-600 nm.

Typically, hard masks are used for coatings e.g. as described herein, and the method may include manufacturing MEMS devices without any optical coating then adding the optical coating after dicing, where the specific layers (material, width, number of layers etc) differs according to customer requirements or use-cases or specific orders.

A method for manufacturing optical elements according to certain embodiments includes manufacturing a stock of diced optical mems elements , typically die level, such as micro-mirrors and subsequently, for each of a stream of orders corresponding to a sequence of use-cases respectively and requiring a specific number of devices having specific requirements in terms of the layers or active optical coatings required, depositing layers or active optical coatings that achieve the requirements of that specific use-case's requirement, atop each of a suitable number of optical elements in stock (to achieve the number of optical elements required by that particular order).

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

While the invention has been described with respect to a limited number of embodiments, it will be appreciated that many variations, modifications and other applications of the invention may be made.

The invention claimed is:

1. A method for manufacturing optical apparatus, the method comprising:
pre-preparing MEMS chips, without any QWP coating, including manufacturing a stock of optical MEMS elements, and
subsequently, according to customers' needs, adding QWP coatings to the MEMS chips as pre-prepared, wherein said adding includes, for at least first and second orders O1 and O2 respectively, from among a stream of orders, each order requiring a specific number of devices having a given number G of optical elements and having specific requirements in terms of active optical coatings required:
selecting G1 diced optical mems elements E1, from the stock, each of which include N1 optical elements where N1 is the number of optical elements required by order O1;
depositing active optical coatings that achieve requirements of said order O1, atop each of the diced optical MEMS elements E1 selected from the stock for order O1, thereby to fill order O1;
selecting G2 diced optical mems elements E2, from the stock, each of which include N2 optical elements where N2 is the number of optical elements required by order O2; and
depositing active optical coatings that achieve requirements of said order O2, atop each of the diced optical mems elements E2 selected from the stock for order O2, thereby to fill order O2,
wherein at least one active optical coating comprises a QWP coating,
wherein a hard mask is used to add QWP coating to the MEMS chips as pre-prepared,
wherein the hard mask is aligned to at least one MEMS element under a microscope, and
wherein at least one MEMS element is pushed, under a microscope, under the hard mask including performing microscopic-level alignment of the MEMS element with the hard mask.

2. The method according to claim 1, wherein said hard mask is formed of metal.

3. The method according to claim 1, wherein said hard mask is formed of silicon.

4. The method according to claim 1, wherein the stock comprises a range of MEMS chips having different numbers of layers thereby to yield MEMS chips with different optical characteristics.

5. The method according to claim 4, wherein the optical characteristics which differ between various MEMS chips in the range, includes reflectivity.

6. The method according to claim 4, wherein the optical characteristics which differ between various MEMS chips in the range, includes polarity.

7. The method according to claim 1, wherein the hard mask is used at die level, on singulated dies diced from wafers.

8. The method according to claim 1, wherein the hard mask is used on wafers.

9. The method according to claim 1, wherein at least one MEMS element is mounted on an Si carrier wafer and the hard mask is then placed on the MEMS element.

10. The method according to claim 9, wherein the hard mask has an oxide-covered side which is brought into engagement with the MEMS element.

11. The method according to claim 1, wherein at least one side of the hard mask is attached to a Si carrier wafer.

12. The method according to claim 11, wherein Kapton tape is used to attach both sides of the hard mask to the carrier wafer.

13. Optical apparatus comprising:
a stock of optical MEMS elements, without any QWP coating, to which, subsequently, has been added, according to customers' needs, QWP coatings, the stock including:
diced optical mems elements E1 selected from the stock, each of which elements E1 includes N1 optical elements where N1 is the number of optical elements required by an order O1, and active optical coatings that achieve requirements of said order O1, are deposited atop each of the diced optical MEMS elements E1 to fill order O1; and
diced optical mems elements E2 selected from the stock, each of which elements E2 includes N2 optical elements where N2 is the number of optical elements required by an order O2; and active optical coatings that achieve requirements of said order O2, are deposited atop each of the diced optical MEMS elements E2 to fill order O2,
wherein at least one of said active optical coatings comprises a QWP coating
wherein the optical apparatus also includes a hard mask used to add QWP coating to the MEMS chips as pre-prepared,
wherein the hard mask is aligned to at least one MEMS element under a microscope, and
wherein at least one MEMS element is pushed, under a microscope, under the hard mask including performing microscopic-level alignment of the MEMS element with the hard mask.

14. A method for manufacturing optical apparatus, the method comprising:
pre-preparing MEMS chips, without any QWP coating, including manufacturing a stock of optical MEMS elements, and subsequently, according to customers' needs, adding QWP coatings to the MEMS chips as pre-prepared, wherein said adding includes, for at least first and second orders O1 and O2 respectively, from among a stream of orders, each order requiring a specific number of devices having a given number G of optical elements and having specific requirements in terms of active optical coatings required:
selecting G1 diced optical mems elements E1, from the stock, each of which include N1 optical elements where N1 is the number of optical elements required by order O1;
depositing active optical coatings that achieve requirements of said order O1, atop each of the diced optical MEMS elements E1 selected from the stock for order O1, thereby to fill order O1;
selecting G2 diced optical mems elements E2, from the stock, each of which include N2 optical elements where N2 is the number of optical elements required by order O2; and
depositing active optical coatings that achieve requirements of said order O2, atop each of the diced optical mems elements E2 selected from the stock for order O2, thereby to fill order O2,
wherein at least one active optical coating comprises a QWP coating,
wherein a hard mask is used to add QWP coating to the MEMS chips as pre-prepared, and
wherein at least one MEMS element is mounted on an Si carrier wafer and the hard mask is then placed on the MEMS element.

15. The method according to claim 14, wherein the optical characteristics which differ between various MEMS chips in the range, includes polarity.

16. A method for manufacturing optical apparatus, the method comprising:
pre-preparing MEMS chips, without any QWP coating, including manufacturing a stock of optical MEMS elements, and
subsequently, according to customers' needs, adding QWP coatings to the MEMS chips as pre-prepared, wherein said adding includes, for at least first and second orders O1 and O2 respectively, from among a stream of orders, each order requiring a specific number of devices having a given number G of optical elements and having specific requirements in terms of active optical coatings required:
selecting G1 diced optical mems elements E1, from the stock, each of which include N1 optical elements where N1 is the number of optical elements required by order O1;
depositing active optical coatings that achieve requirements of said order O1, atop each of the diced optical MEMS elements El selected from the stock for order O1, thereby to fill order O1;
selecting G2 diced optical mems elements E2, from the stock, each of which include N2 optical elements where N2 is the number of optical elements required by order O2; and
depositing active optical coatings that achieve requirements of said order O2, atop each of the diced optical mems elements E2 selected from the stock for order O2, thereby to fill order O2,
wherein at least one active optical coating comprises a QWP coating,
wherein a hard mask is used to add QWP coating to the MEMS chips as pre-prepared, and
wherein at least one side of the hard mask is attached to a Si carrier wafer.

17. The method according to claim 16, wherein the optical characteristics which differ between various MEMS chips in the range, includes polarity.

* * * * *